United States Patent [19]

Peterson et al.

[11] 3,758,797

[45] Sept. 11, 1973

[54] SOLID STATE BISTABLE SWITCHING DEVICE AND METHOD

[75] Inventors: David R. Peterson, Mountain View; James Conragan, Sunnyvale, both of Calif.

[73] Assignee: Signetics Corporation, Sunnyvale, Calif.

[22] Filed: July 7, 1971

[21] Appl. No.: 160,441

[52] U.S. Cl. .......... 307/324, 307/252 E, 317/234 S, 317/234 T, 317/234 V, 317/235 AZ

[51] Int. Cl. .......... H011 19/00

[58] Field of Search .......... 317/235 AZ, 234 T, 317/234 S

[56] References Cited

UNITED STATES PATENTS

| | | | |
|---|---|---|---|
| 3,631,308 | 12/1972 | Krolikowski | 317/234 T |
| 3,604,988 | 9/1971 | Kahng et al. | 317/235 AZ |
| 3,575,745 | 4/1971 | Hill | 317/235 AZ |
| 3,648,340 | 3/1972 | MacIver | 317/235 AZ |
| 3,491,433 | 1/1970 | Kawamura et al. | 317/235 AZ |
| 3,319,137 | 5/1967 | Braunstein et al. | 317/234 S |
| 3,500,142 | 3/1970 | Kahng | 317/235 AZ |

FOREIGN PATENTS OR APPLICATIONS

| | | | |
|---|---|---|---|
| 6,705,547 | 10/1967 | Netherlands | 317/234 T |
| 735,132 | 5/1966 | Canada | 317/234 S |
| 813,537 | 5/1969 | Canada | 317/235 AZ |

OTHER PUBLICATIONS

Flannery et al., "Electron Transfer Processes Through Ta–Ta2O5 Diodes," J. Appl. Phys. Vol. 37, No. 12, pp 4417–4418 (Nov. 1966)

Drangeid et al., "MESFET," IBM Tech. Discl. Bull, Vol. 12, No. 9, Feb. 1970, page 1361

*Primary Examiner*—John W. Huckert
*Assistant Examiner*—William D. Larkins
*Attorney*—Flehr, Hohbach, Test, Albritton & Herbert

[57] ABSTRACT

Solid state bistable switching device having a semiconductor body with multiple dielectric layers carried by the semiconductor body and a metal electrode carried by the multiple dielectric layers with the device exhibiting diode-like characteristics with the forward direction occurring when the electrode is positive and a bistable switching characteristic between high and low conductive states when the electrode is reverse biased. In the method for fabricating a solid state bistable switching device, successive dielectric layers are formed on the body of semiconductor material and a metal electrode is formed on the dielectric layers. A negative potential is applied across the electrode to cause the device to assume a low conductivity state and then a signal in the form of electricity or light can be applied to the device to cause a predetermined threshold voltage to be exceeded to cause the device to switch from the low conductivity state to a high conductivity state.

12 Claims, 6 Drawing Figures

PATENTED SEP 1 1 1973 3,758,797

INVENTORS
David R. Peterson
James Conragan
BY Flehr, Hohbach, Test, Albritton & Herbert
Attorneys

SOLID STATE BISTABLE SWITCHING DEVICE AND METHOD

BACKGROUND OF THE INVENTION

This invention relates to switching devices and more particularly to solid bistable switching devices.

Although switching devices have heretofore been provided, solid state switching devices have not been readily available. One type of solid state device which has received some publicity has been identified as the Ovshinsky semiconductor glass switch. Such devices have not been particularly satisfactory nor have they met with any appreciable commercial success. There is, therefore, a need for a new and improved solid state bistable switching device.

SUMMARY OF THE INVENTION AND OBJECTS

The solid state bistable switching device consists of a semiconductor body having a planar surface. First and second dielectric layers are disposed on the surface with the dielectric layers being formed of two different materials so that the first dielectric layer serves as a barrier layer and the second dielectric layer serves as a current carrying layer. An electrode is disposed on the second dielectric layer so that when a potential is placed on the electrode, the device exhibits diode-like characteristics with the forward direction occurring when the electrode is positive and a bistable switching characteristic between high and low conductance states when the electrode is negative.

In the method for fabricating a solid state bistable switching device, a body of semiconductor material having a planar surface is provided. A first layer and then a second layer of dielectric materials are formed on the surface and then an electrode is formed on the second dielectric layer.

In the method of operating the solid state bistable switching device, a negative potential is applied to the electrode to cause the device to assume a low conductivity state and thereafter a higher negative potential above a predetermined threshold voltage is applied to the electrode to cause the device to switch from a low conductivity state to a high conductivity state.

In general, it is an object of the present invention to provide a solid state bistable switching device and method.

Another object of the invention is to provide a device and method of the above character in which switching can be accomplished by the use of a signal in the form of electricity or light.

Another object of the invention is to provide a device and method of the above character which makes possible a high performance level.

Another object of the invention is to provide a device and method of the above character which permits ready integration into integrated circuits.

Another object of the invention is to provide a device of the above character which can be utilized for operating other devices.

Additional objects and features of the invention will appear from the following description in which the preferred embodiments are set forth in detail in conjunction with the accompanying drawing.

DESCRIPTION OF THE PREFERRED EMBODIMENTS

Figure 1:
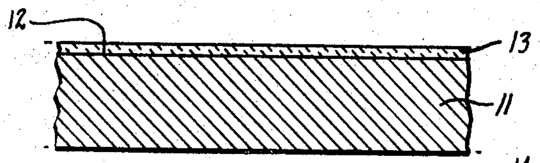
FIGS. 1 and 2 are cross-sectional views showing the steps which are utilized for fabricating the solid state bistable switching device incorporating the present invention.
Figure 2:
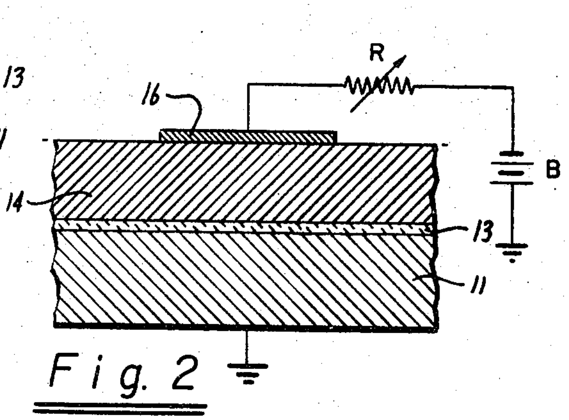

As shown in FIGS. 1 and 2 of the drawings, the steps for fabricating a switching device incorporating the present invention consist of first taking a semiconductor body 11 formed of a suitable material such as silicon. Although single crystal silicon is the preferred material, polycrystalline silicon can also be utilized. In addition, it also should be possible to use gallium arsenide and perhaps tin oxide. For switching thresholds in the neighborhood of 150 volts, a resistivity of 6 to 9 ohm centimeter in N-type silicon can be utilized. For low threshold voltages as, for example, in the vicinity of 20 volts, 1 ohm centimeter N-type silicon can be used. Depending upon the threshold voltage desired, resistivities ranging from 1 to 50 ohm centimeter can be used. The thickness of the semiconductor body or wafer 11 is of little importance. However, it should be thick enough to accommodate the full width of the depletion layer which is formed in the switching device. As is well known to those skilled in the art, the resistivity determines the width of the depletion layer which, in turn, determines the thickness required for the wafer 11. In certain applications of the device, it may be desirable to illuminate the device from the back side in which case it would be desirable that the depletion layer extend all the way through the bulk of the silicon semiconductor body 11. Thus, in such an application of 6 – 9 ohm centimeter material, the semiconductor body 11 would be quite thin as, for example, 20 to 40 microns, whereas for a 1 ohm centimeter material, the thickness could be in the order of 2 microns.

The semiconductor body 11 is provided with a top planar surface 12 which is covered with a layer 13 of a suitable dielectric such as silicon dioxide to serve as a barrier layer. As is well known to those skilled in the art, such a layer 13 can be thermally grown or it can be deposited. When the layer is thermally grown, it is grown in an oxidizing atmosphere in a furnace. For example, a layer of suitable thickness can be formed by placing the wafer in a furnace for approximately one hour in a dry oxygen atmosphere at a temperature of approximately 650°C. The layer 13 could have a thickness ranging from 5 to 50 Angstroms and would typically have a thickness of 25 Angstroms.

As soon as the layer 13 has been formed which serves as a tunneling barrier as hereinafter described, a current carrying layer 14 is formed on the layer 13. This layer is preferably formed of tantalum oxide $Ta_2O_5$ to a thickness ranging from approximately 200 to 2,000 Angstroms. The tantalum oxide can be formed in a suitable manner such as by vapor pyrolysis of penta ethyltantalate. Other materials may be utilized for obtaining the tantalum oxide as, for example, chloride compounds as well as other organic tantalum compounds other than the ethyl compounds. Other tantalum compounds would be methyl and isopropyl compounds of tantalum.

In the pyrolysis of the tantalum organic compound, it is volatilized by heating to approximately 180°C. The volatiles which are driven off are carried by an inert gas such as nitrogen over the exposed surface of the silicon dioxide layer 13. These volatiles are permitted to mix with oxygen brought in with a separate gas stream and water vapor from the air to form the tantalum oxide layer 14.

The dielectric layer 14 should have a high dielectric constant ranging from 20 to 100. Tantalum oxide has a dielectric constant of approximately 25.

After the tantalum oxide layer 14 has been formed, a counter electrode 16 in the form of a thin layer of suitable metal such as high purity aluminum is formed on the layer 14. This metal counter electrode 16 can be formed by vapor depositing the aluminum in a vacuum onto the tantalum oxide layer and then utilizing photolithographic techniques to remove the undesired portions of the aluminum layer. This completes construction of the device. It thereafter can be packaged in a suitable manner such as by mounting it on a TO-5 header in a manner well known to those skilled in the art.

The device shown in FIG. 2 can then be tested by applying a negative potential from the battery B to the top electrode 16 and by grounding the semiconductor body 11 as shown so that a contact is made with the grounded positive side of the battery b.

Figure 3:
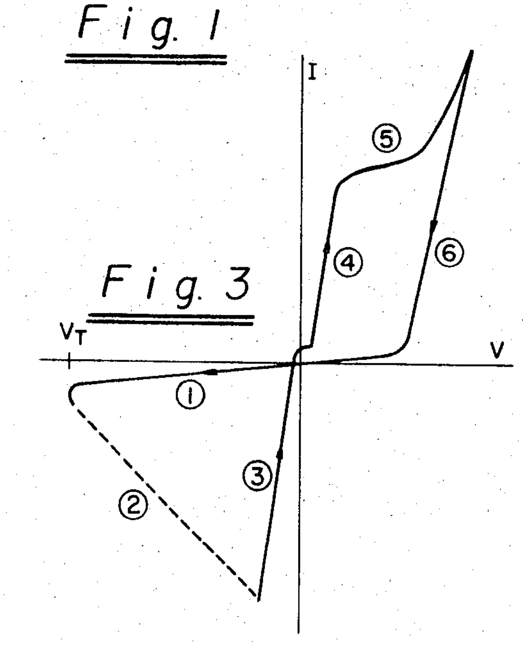
FIG. 3 is a curve showing the dynamic I–V characteristic of the solid state bistable switching device in response to a 60 cycle sine wave.
Figure 4:
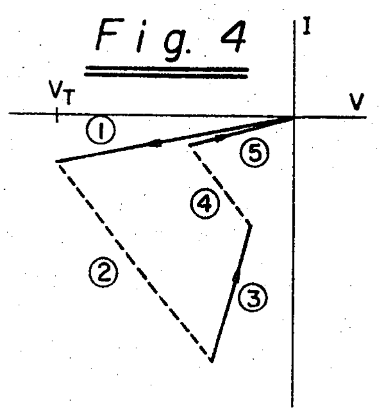
FIG. 4 is a curve showing the static reverse bias I–V characteristic for d.c.

Operation of the device shown in FIG. 2 may now be briefly described as follows in conjunction with the curves that are shown in FIGS. 3 and 4. The I-V characteristic as shown in FIG. 3 is generated by a 60 cycle sine wave. Assuming that a start is made from zero potential and that the negative potential is being increased on the counter electrode 16 as represented by line 1, a depletion layer is generated in the silicon body 11 which continues to increase in size so that most of the voltage drop occurs across the depletion layer with a very small voltage drop across the silicon dioxide layer 13 and the tantalum oxide layer 14 until the threshold voltage $V_T$ is reached which, by way of example, can be in the range of 150 to 300 volts.

Although it is not exactly understood, it is believed that when the threshold voltage $V_T$ is reached, an avalanche breakdown occurs. Prior to this avalanche breakdown, it is believed that electrons have been pushed away from the silicon dioxide and silicon interface and that holes are accumulating at the surface 13 of the silicon body 11. At the threshold voltage $V_T$, avalanche breakdown occurs because it is believed that additional electron hole pairs are generated which build up a much stronger space charge at the silicon-silicon dioxide interface.

When avalanche breakdown occurs at the threshold voltage $V_T$, there is a much higher concentration of holes in the surface of the silicon body at the silicon-silicon dioxide interface so that "hot" holes are created. The hot holes which have accumulated can be injected into the silicon dioxide dielectric layer so that they are trapped at the interface between the silicon dioxide layer 13 and the tantalum oxide layer 14. The holes which have accumulated at the surface 13 of the semiconductor body 11 form an inversion layer which reduces the net potential drop in the silicon body 11 and increases the potential drop in the tantalum oxide layer. If the potential drop or, in other words, the field in the tantalum oxide layer 14 is increased sufficiently, there will be electron injection from the aluminum counter electrode 16 into the tantalum oxide layer. Electron injection permits electron flow through the tantalum oxide layer to the interface between the tantalum oxide layer and the silicon dioxide layer. A certain portion of these electrons which flow to the interface will be combined with holes that are trapped at this interface. However, a reasonable portion of these injected electrons will tunnel through the dielectric layer 14. When this occurs, more electrons are dumped into the inversion layer which has been created near the surface 12 of the semiconductor body 11 and thence into the depletion layer. This, in turn, generates more electron hole pairs by avalanche action and maintains the process.

Thus, as avalanche action occurs as represented by the line 2 in FIG. 3, there is a transition from a low conductivity state or condition as represented by the end of line 1 and a high conductivity state or condition as represented by the beginning of line 3.

It appears that there is a double injection process with electrons coming from the aluminum counter electrode 16 and with holes coming from the silicon body 11. The creation of the electrons and the holes has two effects which combine to lower the potential so that there is a sufficient field in the tantalum oxide layer 14 to allow conduction of current without thermal destruction. It is possible that the avalanche breakdown occurring in the tantalum oxide layer 14 is at the edge of the counter electrode. Since the tantalum oxide has a relatively high dielectric constant, the field which is created would have a tendency to crowd in the tantalum oxide in a region immediately adjacent the edge of the counter electrode 16 to provide an excellent environment for the avalanche generation of carriers.

The lowermost point of the line 3 as shown in FIG. 3 represents the maximum current flow which would be limited by the total series resistance in the circuit. The maximum current also can be limited externally by the use of the potentiometer R to prevent too much current flowing in the device which could destroy the device.

If the voltage is held constant, the current will remain constant. However, if the voltage is decreased rapidly, the current which will flow will follow line 3 back generally to the zero point of origin. As the counter electrode 16 becomes less negative, a positive space charge is created which rapidly becomes strong enough so that current will flow in an opposite direction as represented by the line 4. Upon creation of the positive space charge, electrons are injected from the semiconductor body 11 into the interface between the silicon dioxide layer 13 and the silicon 11. All the electrons do not recombine at the interface so that there is a substantial number that are available for conduction to the tantalum oxide layer 14. The positive space charge will enhance the tunneling of the electrons from the silicon body to the tantalum oxide and into the aluminum counter electrode 16. Thus, there is a transition from a high conductivity state or condition as represented by the beginning of line 4 to a low conductivity state or condition as represented by the beginning of line 5. This lower conductivity state continues until a positive space charge which has been formed is neutralized by holes recombining with electrons to actually start building up a negative space charge. With a certain voltage, the maximum current will remain at a steady state condition until the voltage which is applied to the device is decreased to cause the current to follow line 6 downwardly until the conductivity approaches zero. At this point, there is a small potential between the silicon and the tantalum oxide silicon dioxide interface so that there is very little change in the current flow as the voltage is decreased to zero and meets with line 1. The same cycle would then be repeated.

The I–V characteristic that is provided by the switching device when d.c. voltage is utilized is shown in FIG. 4. Again, assuming that a start is made at zero and that the d.c. voltage is made more negative, a path or line 1 is followed until the threshold voltage $V_T$ is reached, at which time a switching transient occurs between the low conductivity state represented by the end of line 1 and a high conductivity state represented by the beginning of line 3. As the voltage is decreased, the current will decrease following line 3 until line 4 is reached. Line 4 is reached when there is a low enough current so that a positive space charge is no longer maintained. When electrons are injected from the aluminum counter electrode into the tantalum oxide layer, these electrons are neutralizing the holes of the interface at a faster rate than they can be built up due to the avalanche process. As soon as this occurs, the holes are neutralized and the line 4 is reached which ends at a low conductivity state. The voltage is further decreased to attain zero current flow, or, alternatively, it can be increased to follow line 1 again.

In summary, starting at zero potential and applying a negative going voltage to the electrode 16 results in the traversal of a low conductivity region (line 1 in FIGS. 3 and 4) until a threshold voltage $V_T$ is reached. Upon reaching $V_T$, a regenerative switching transient takes place at the beginning of line 2 resulting in a high conductivity state at the beginning of line 3. The switching and high conductivity states can be the result of avalanche generation of holes (near the edge of the electrode 16 but in the depletion region in the silicon 11), trapping of the holes at the silicon dioxide-tantalum oxide interface resulting in electron injection from the electrode 16 and subsequent generation of additional holes through avalanche processes induced by the injected electrons. Reduction in applied voltage results in return to the low conductivity state in the d.c. case (FIG. 4 represented by lines 4 and 5) or the onset of a high conductivity state in a forward direction (represented by line 4 in FIG. 2 in the a.c. case followed by a transition to a lower conductivity state represented by lines 5 and 6 in FIG. 3). The transition from line 5 to line 6 in the a.c. case is probably due to a reversal in the sign of the space charge in the silicon dioxide tantalum oxide layers. Illumination of the device shown in FIG. 2 will also cause transition from states 1 to 3 for voltages less than $V_T$.

From the foregoing, it can be seen that the device shown in FIG. 2 is a bistable solid state switch. The device exhibits diode-like characteristics with the forward direction occurring with the electrode being positive. A bistable switching characteristic between a low and high conductance state is observed when the device is reverse biased. Switching from the low to the high conductance state can be initiated by supplying a signal to the device, either electrical or light, by either exceeding a threshold voltage or by illumination of the device under appropriate bias. Turn-off is accomplished by removing the applied bias for a predetermined period of time as, for example, 20 milliseconds. The top electrode 16 defines the area of the device in which it serves as one element of a capacitor with the tantalum oxide layer 14 serving as the dielectric for the capacitor which is capable of carrying a significant current without thermal destruction of the dielectric.

The bistable device can be used in many applications. For example, it can be used in a manner similar to a flip-flop. It could be biased with a supply voltage which is less than the threshold voltage to thus bias the device in state 1. A trigger pulse applied to the electrode could raise the total voltage across the device so that it is greater than the threshold voltage so that it will switch to state 3 or a high conductivity state. To change the state of the device from state 3 to state 1, another pulse could be applied which would drop the bias value of voltage to cause a transition from high conductivity to low conductivity as hereinbefore described.

It is possible that the device may be frequency limited because of the time required to charge up the interface to go from a low conductivity to a high conductivity state, or vice versa. It is believed that if high current is being utilized, the transition time will be substantially less than if low current is being utilized.

As pointed out above, the bistable device, in addition to being capable of being switched by the application of electrical signals thereto, can also be switched by the use of light signals. For such applications, again the device can be biased below the threshold voltage as, for example, 10 percent below the threshold voltage. Shining a light on the device will cause the generation of electron hole pairs in the depletion region in the semiconductor body so that switching will occur. It is preferable to shine the light on the top side of the device or on the side in which the tantalum oxide layer is exposed. The back side can be exposed to light to also cause triggering or switching of the device.

Alternatively, in place of light, an electron beam can be utilized for causing switching.

Figure 5:
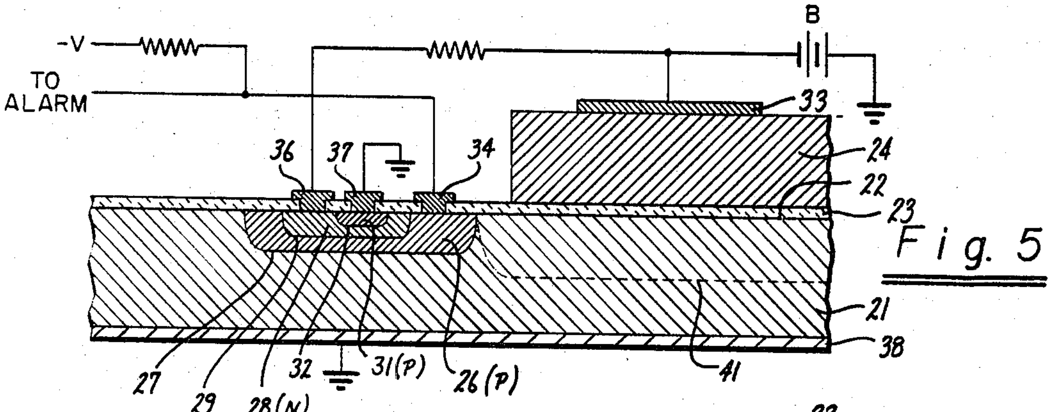
FIG. 5 is a cross-sectional view showing a portion of an integrated circuit including a device incorporating the present invention.

An application of the switching device in an integrated circuit is shown in FIG. 5 in which there is provided an N-type semiconductor body 21 having a planar surface 22 upon which there is deposited a silicon dioxide dielectric layer 23. A tantalum oxide layer 24 is formed on the layer 23. The other parts of the integrated circuit are formed in the body 21. As for example, a transistor as shown in FIG. 5 is formed in the body by diffusing impurities through the surface 22 to provide a P-type region 26 defined by a dish-shaped P-N junction 27 which extends to the surface, an N-type region 28 defined by a P-N dish-shaped junction 29 which extends to a surface, and a P-type region 31 defined by a dish-shaped P-N junction 32 which also extends to the surface. Openings are formed in the silicon dioxide layer 22 and metallization is deposited on the surface and on the tantalum oxide layer 24. Thereafter, the undesired metal is removed by suitable photolithographic techniques so that there remains the electrode 33 on the tantalum oxide layer 24, a collector contact 34, a base contact 36 and an emitter contact 37. A metal layer 38 is provided on the bottom side of the semiconductor body 21 which is grounded as shown in FIG. 5. The depletion region is formed as indicated by the broken line 41. Other portions of the integrated circuit have been omitted and are shown schematically by the circuitry connected in the integrated circuit shown in FIG. 5 and which are connected to appropriate voltages as shown. The integrated circuit shown in FIG. 5 could serve as a light detector.

Assuming that the switching device portion of the integrated circuit shown in FIG. 5 is in the low conductivity state, a large negative voltage is applied to the electrode 33 and also to the base of the P-N-P transistor. The transistor would be turned on and would have a high collector current. If it is assumed that the device shown in FIG. 5 is utilized for detecting light as, for example, for detecting pin holes in sheets of material such as steel, light shining through a pin hole would impinge upon the tantalum oxide layer 24 which would trigger the switching device which, in turn, would reduce the bias voltage on the P-N-P transistor to cut off or considerably reduce the collector current of the transistor to thereby give a suitable indication or to give an alarm that light had been detected.

By way of example, switching devices constructed in accordance with the present invention had 16 electrodes of approximately 30 mils in diameter. The devices can be quite small. It is only necessary that they be made larger when it is desired that they be able to carry high currents.

Figure 6:
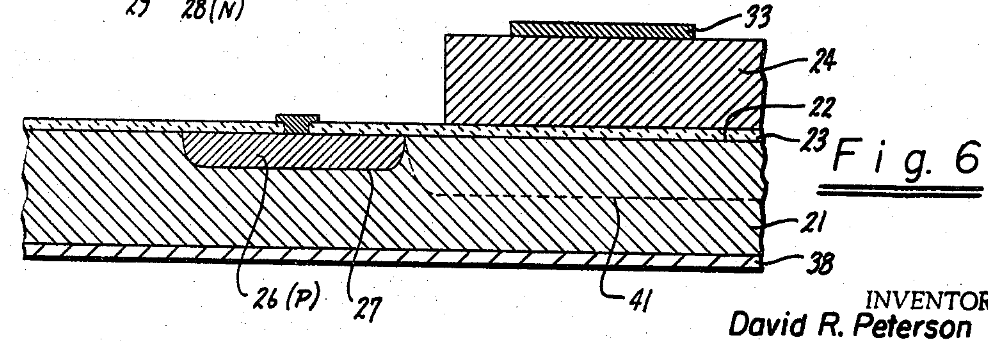
FIG. 6 is another cross-sectional view of an integrated circuit incorporating the present device.

In FIG. 6, there is shown another embodiment of the invention in which the switching device is utilized for triggering a diode to serve as a high voltage switch as, for example, for driving a Nixie tube or where high current carrying capabilities are required. The diode switch will be triggered by the depletion region 41 entering the P-type region of the diode as shown in FIG. 6.

In FIG. 6, the two additional regions 28 and 31 have been omitted so that there is only the one P-type region 26 to form the diode. The structure shown in FIG. 6 could form a part of the high voltage portion of an integrated circuit.

It is apparent from the foregoing that a semiconductor-multiple dielectric-metal solid state bistable switch has been provided in which switching can be initiated by either exceeding a threshold voltage or by illumination under appropriate bias. The device can be used to operate phosphorus panels, Gallium Arsenide LED and neon tubes. It also can be incorporated into integrated circuits.

We claim:

1. In a solid state bistable switching device, a semiconductor body having a surface, first and second dielectric layers disposed on said surface an electrode disposed on said second dielectric layer, and means for applying a voltage between the electrode and the semiconductor body to cause a current to flow continuously through said first and said second dielectric layers when a voltage is applied whereby when a voltage of one polarity is applied to the electrode, the device exhibits diode-like characteristics in the forward direction and when a potential of opposite polarity is applied to the electrode, the device exhibits a bistable switching characteristic between high and low current conductive states, said bistable switching characteristic being exhibited when a threshold value is reached, said device being in a low current conductive state when the potential of opposite polarity is applied until the threshold value is reached and a high current conductive state after the threshold value is reached, said device returning automatically to a ground state as soon as the voltage applied by said means applying a voltage is removed.

2. A device as in claim 1 wherein said semiconductor body is formed of silicon, wherein said first dielectric layer is formed of silicon dioxide and wherein said second dielectric layer is formed of tantalum oxide.

3. A device as in claim 2 wherein said semiconductor body is formed of N-type silicon.

4. A device as in claim 1 wherein said means for applying a voltage includes means for applying a voltage of opposite polarity which is below the threshold value.

5. A device as in claim 4 wherein said means for applying a signal voltage to the device which is sufficient to exceed the threshold voltage of the device.

6. A device as in claim 4 together with means for supplying illumination to the device to cause the threshold voltage to be exceeded and to cause the device to switch from a low conductive to a high conductive state.

7. A device as in claim 1 wherein said second dielectric layer has a high dielectric constant ranging from 20 to 100.

8. A device as in claim 1 wherein said second dielectric layer has a thickness ranging from 200 to 2000 Angstroms.

9. A device as in claim 1 together with an active circuit element formed in the semiconductor body and means coupling the active circuit element to the electrode.

10. In a method for providing a solid state bistable switching device, providing a semiconductor body having a surface forming a first dielectric layer disposed on said surface, forming a second dielectric layer disposed on said first dielectric layer, forming an electrode disposed on said second dielectric layer, applying a voltage between the electrode and the semiconductor body to cause a current to flow continuously through said first and said second dielectric layers when a voltage is applied whereby when a voltage of one polarity is applied to the electrode, the device exhibits diode-like characteristics in the forward direction and when a potential of opposite polarity is applied to the electrode, the device exhibits a bistable switching characteristic between high and low current conductive states, said bistable switching characteristic being exhibited when a threshold value is reached, said device being in a low current conductive state when the potential of opposite polarity is applied until the threshold value is reached and a high current conductive state after the threshold value is reached, said device returning automatically to a ground state as soon as the applied voltage is removed.

11. A method as in claim 10 wherein said signal is a voltage.

12. A method as in claim 10 wherein said signal is in the form of light.

* * * * *